(12) United States Patent
Murao

(10) Patent No.: US 9,758,310 B2
(45) Date of Patent: Sep. 12, 2017

(54) ARTICLE TRANSPORT DEVICE

(71) Applicant: Daifuku Co., Ltd., Osaka-shi (JP)

(72) Inventor: Kazuhiro Murao, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/403,604

(22) Filed: Jan. 11, 2017

(65) Prior Publication Data

US 2017/0197795 A1 Jul. 13, 2017

(30) Foreign Application Priority Data

Jan. 12, 2016 (JP) .................................. 2016-003563

(51) Int. Cl.
| | |
|---|---|
| *B65G 43/00* | (2006.01) |
| *H01L 21/00* | (2006.01) |
| *B65G 17/20* | (2006.01) |
| *H01L 21/677* | (2006.01) |
| *H01L 21/67* | (2006.01) |
| *B65G 47/90* | (2006.01) |

(52) U.S. Cl.
CPC .......... *B65G 43/00* (2013.01); *B65G 47/902* (2013.01); *H01L 21/67259* (2013.01); *H01L 21/67706* (2013.01); *H01L 21/67712* (2013.01); *B65G 2201/0297* (2013.01); *B65G 2203/0208* (2013.01)

(58) Field of Classification Search
CPC .... B65G 2203/0266; B65G 2203/0275; B65G 2203/0283; B65G 2203/0291; B65G 43/00; B65G 2201/0297; B65G 2203/0208; B65G 17/20; H01L 21/67259; H01L 21/67706; H01L 21/67712
See application file for complete search history.

(56) References Cited

U.S. PATENT DOCUMENTS

| | | | |
|---|---|---|---|
| 2015/0274491 A1* | 10/2015 | Yada ....................... | B66C 1/101 |
| | | | 414/591 |
| 2016/0293464 A1* | 10/2016 | Wada ................... | H01L 21/6773 |
| 2017/0137240 A1* | 5/2017 | Tsuji ...................... | B65G 69/22 |

FOREIGN PATENT DOCUMENTS

| | | | | |
|---|---|---|---|---|
| JP | 2005225598 A | | 8/2005 | |
| JP | WO 2014017222 A1 * | | 1/2014 | ....... H01L 21/67288 |
| JP | WO 2015076086 A1 * | | 5/2015 | ......... H01L 21/6773 |

* cited by examiner

*Primary Examiner* — Mark A Deuble
(74) *Attorney, Agent, or Firm* — The Webb Law Firm

(57) ABSTRACT

A controller provided to an article transport device is configured to perform a transfer control and an oscillation damping control. The transfer control is a control for controlling an operation of an actuator while a travel portion is at rest to cause a first support portion to be moved with respect to the travel portion between a first position within a travel path and a second position for transferring an article between the first support portion and a transport target location which is one of a transport origin and a transport destination for the article. The oscillation damping control is a control for controlling the operation of the actuator based on a physical quantity detected by a detector, while the travel portion is traveling and the first support portion is supporting an article, to reduce the oscillation of the article supported by the first support portion that occurs while the travel portion is traveling.

5 Claims, 8 Drawing Sheets

ARTICLE TRANSPORT DEVICE

CROSS-REFERENCE TO RELATED APPLICATION

This application claims priority to Japanese Patent Application No. 2016-003563 filed Jan. 12, 2016, the disclosure of which is hereby incorporated in its entirety by reference.

FIELD OF THE INVENTION

The present invention relates to an article transport device comprising a travel portion configured to travel along a travel path, a first support portion configured to support an article, an actuator configured to move the first support portion with respect to the travel portion along at least one of a plurality of perpendicular directions which are perpendicular to a direction along the travel path, and a controller configured to control operation of the actuator.

BACKGROUND

An example of known article transport devices, such as one described above, is described in JP Publication of Application No. 2005-225598 (Patent Document 1). Patent Document 1 describes an article transport device having a swiveling table [41] which can rotate an article supported by a vertically movable member [30] about a vertical axis, and also describes a control performed to rotate the article about the vertical axis by means of the swiveling table [41] to match the orientation of the article to the article receiving platform [5] which is a transport target location. In addition, Patent Document 1 describes, in Paragraphs 0038 and 0044, etc., an oscillation damping control for reducing any oscillation of the vertically movable member [30] which may occur when rotating the swiveling table [41] in such a manner.

SUMMARY OF THE INVENTION

Incidentally, such oscillation (back and forth motion) of the article supported by a first support portion may also occur simply by the traveling of the travel portion, without having to rotate the article about the vertical axis. Types of oscillations that can be expected to occur include, for example, a vertical oscillation of the article caused by a step or a curve in a rail along which the travel portion travels, and an oscillation of the article along the lateral width direction (path width direction) of the travel path caused by an inertial force, such as a centrifugal force, that acts on the article. And as such, such oscillations of the article that result from the traveling of the travel portion are entirely different from the oscillation which occurs in the vertically movable member when rotating an article about a vertical axis and which is what the control of Patent Document 1 aims to control. However, no direct solutions are considered in Patent Document 1 regarding the oscillations of the article that result from the traveling of the travel portion. And naturally, no oscillation damping control for reducing and damping the oscillations of the article resulting from the traveling of the travel portion is described in Patent Document 1.

Thus, an article transport device is desired in which an oscillation of an article resulting from the traveling of a travel portion can be reduced by means of a relatively simple arrangement.

In light of the above, an article transport device comprises: a travel portion configured to travel along a travel path; a first support portion configured to support an article; an actuator configured to move the first support portion with respect to the travel portion along at least one of a plurality of perpendicular directions which are perpendicular to a direction along the travel path; a controller configured to control operation of the actuator; a detector configured to detect a physical quantity that represents a motion, with respect to the travel portion, of the article supported by the first support portion along a moving direction along which the first support portion is moved with respect to the travel portion by the actuator; wherein the controller is configured to perform a transfer control and an oscillation damping control, wherein the transfer control is a control for controlling an operation of the actuator while the travel portion is at rest to cause the first support portion to be moved with respect to the travel portion between a first position within the travel path and a second position for transferring the article between the first support portion and a transport target location which is one of a transport origin and a transport destination for the article, and wherein the oscillation damping control is a control for controlling operation of the actuator based on the physical quantity detected by the detector while the travel portion is traveling and the first support portion is supporting an article, to reduce an oscillation of the article supported by the first support portion that occurs while the travel portion is traveling.

With the arrangement described above, by the oscillation damping control performed by the controller, the oscillation of the article supported by the first support portion that occurs while the travel portion is traveling (i.e., oscillation resulting from the traveling of the travel portion) can be reduced. And such reduction in the oscillation that occurs while the traveling portion is traveling is done by controlling the operation of the actuator provided to the article transport device for transferring an article between the article transport device and a transport target location. In other words, an oscillation damping control can be performed through an effective use of the actuator and a controller that are already provided to the article transport device, without having to provide a separate device exclusively for an oscillation damping control. In addition, the performance (processing power etc.) required of the controller is not increased excessively by requiring it to perform the oscillation damping control because the actuator is not operated for the purpose of transferring an article while the travel portion is traveling during which the oscillation damping control is performed, i.e., because the period in which the oscillation damping control is performed does not overlap with the period in which the transfer control is performed.

As such, with the arrangement described above, an article transport device can be provided in which an oscillation of an article resulting from the traveling of a travel portion can be reduced by means of a relatively simple arrangement.

DETAILED DESCRIPTION

Figure 1:
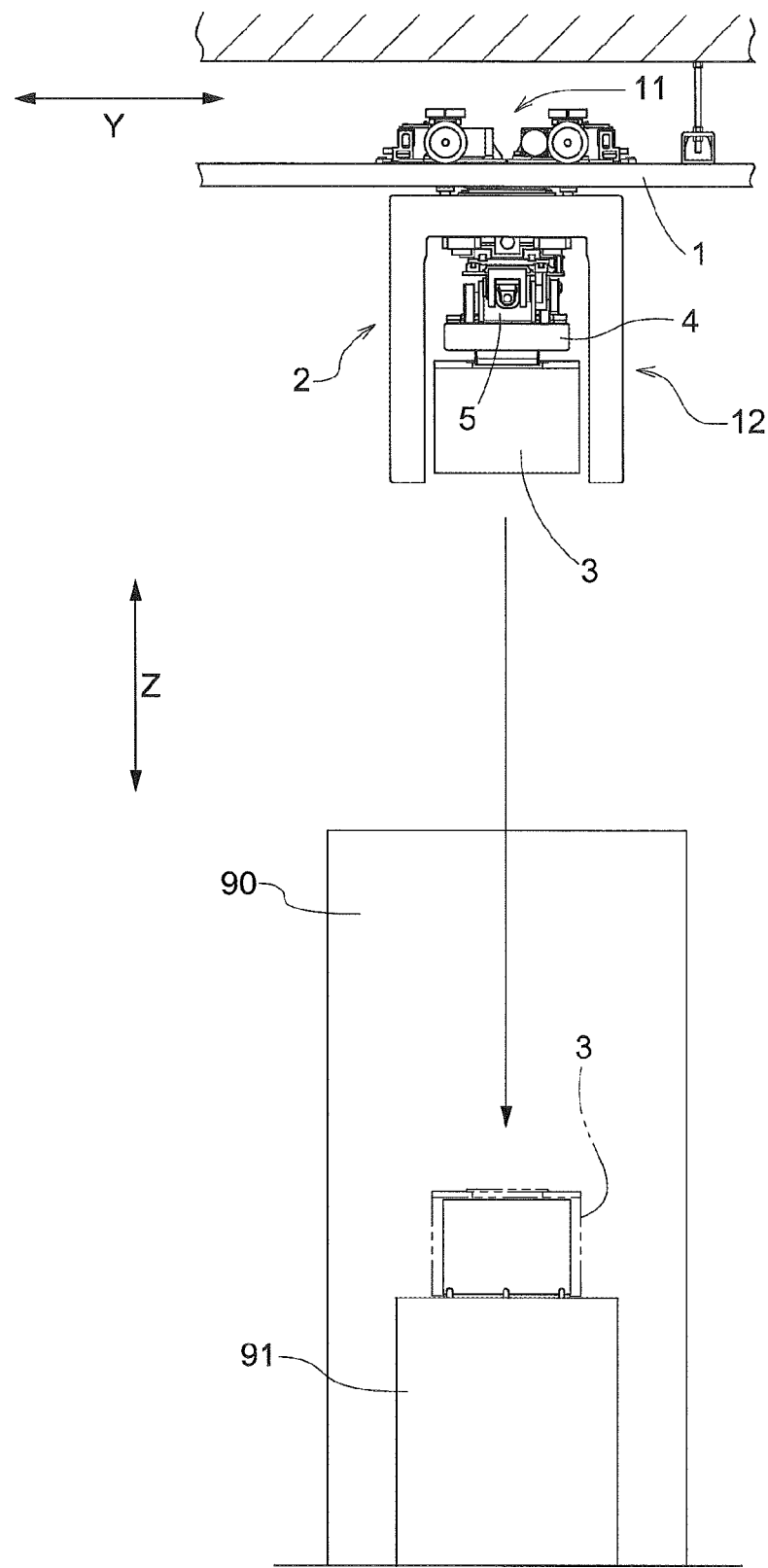
FIG. 1 shows an article transport device with a first support portion located at a first position.

Embodiments of an article transport device are described with reference to drawings. As shown in FIGS. 1-5, the article transport device 2 has a travel portion 11 configured to travel along a travel path, a first support portion 4 configured to support an article 3, an actuator device 26 configured to move the first support portion 4 with respect to the travel portion 11, and a controller 80 configured to control the operation of the actuator device 26. The first support portion 4 is supported by the travel portion 11, and is moved along the travel path as the travel portion 11 travels along the travel path. In the present embodiment, the article transport device 2 also has a second support portion 5 which is supported by the travel portion 11, and which suspends and supports the first support portion 4. And thus, the first support portion 4 is supported by the travel portion 11 through the second support portion 5. In the present embodiment, the actuator device 26 is, or corresponds to, the "actuator", and the controller device 80 is, or corresponds to, the "controller".

The actuator device 26 is configured to move the first support portion 4 with respect to the travel portion 11 along at least one of a plurality of perpendicular directions which are perpendicular to the direction along the travel path (referred to, hereinafter, as the "path longitudinal direction Y"). In the present embodiment, the actuator device 26 is configured to move the first support portion 4 with respect to the travel portion 11 along the path width direction X and the vertical direction Z direction respectively, which are two of the perpendicular directions. Here, the path width direction X is the lateral width direction of the travel path. That is, the path width direction X is perpendicular to both the path longitudinal direction Y and the vertical direction Z. In the present embodiment, travel rails 1 are installed so that they extend along the path longitudinal direction Y as described below.

The article transport device 2 is provided with detecting devices 40 each configured to detect a physical quantity (hereinafter "specific physical quantity") that represents a motion, with respect to the travel portion 11, of an article 3 supported by the first support portion 4. Each detecting device 40 detects a specific physical quantity along a direction of movement of the first support portion 4 with respect to the travel portion 11 caused by the actuator device 26. In the present embodiment, the directions of movement are the path width direction X and the vertical direction Z. And each detecting device 40 detects the specific physical quantity along each of the path width direction X and the vertical direction Z. In the present embodiment, each detecting device 40 is, or corresponds to, the "detector".

Figure 2:
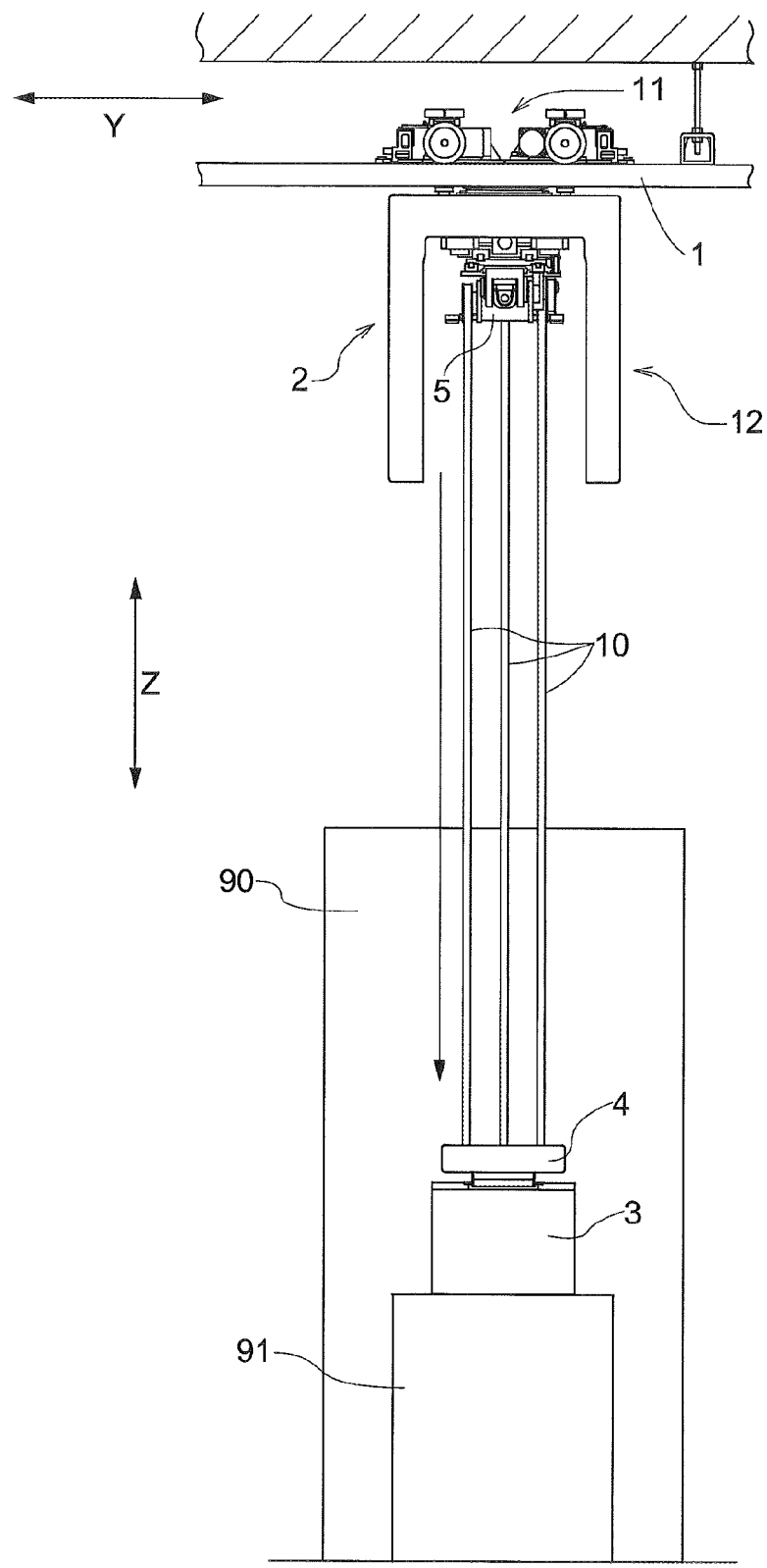
FIG. 2 shows the article transport device with the first support portion located at a second position.
Figure 3:
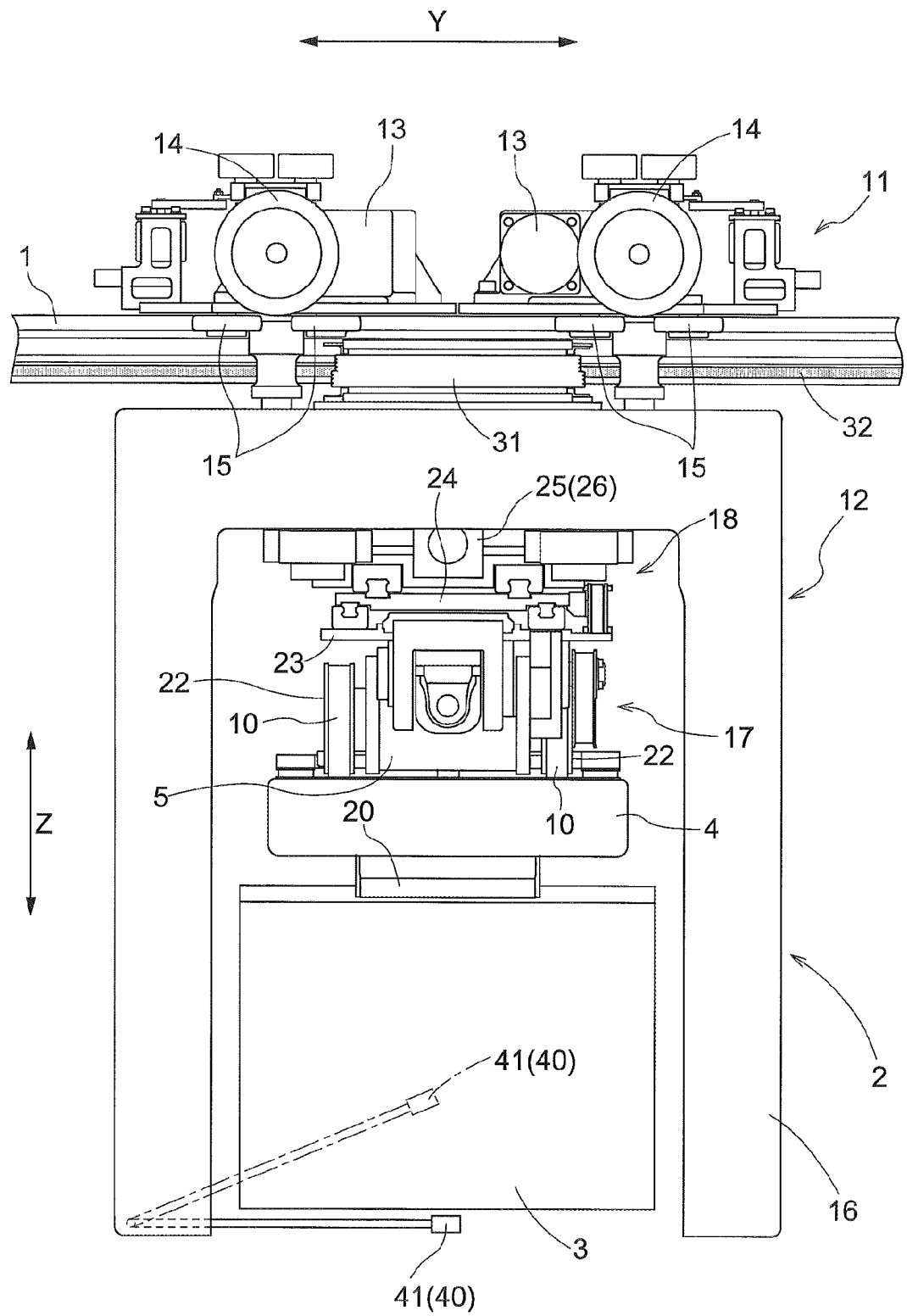
FIG. 3 is a side view of the article transport device.

In the present embodiment, as shown in FIGS. 1 and 2, the travel portion 11 travels along the travel path installed on the ceiling side (i.e., close to the ceiling). The travel path is an extent of space through which the travel portion 11, a main body portion 12, and an article 3 supported by the first support portion 4 move when the travel portion 11 travels. The main body portion 12 is a portion of the article transport device 2 that is supported by the travel portion 11. And the main body portion 12 includes the first support portion 4 and the second support portion 5. In the present embodiment, as shown in FIGS. 1 and 3, the space through which the article 3 moves when the travel portion 11 travels is included in the space through which the main body portion 12 moves when the travel portion 11 travels. The travel path is formed such that it extends by way of, or adjacent, a plurality of transport target locations 91. Any of the transport target locations 91 can serve as a transport origin or a transport destination for an article 3 that is being transported by the article transport device 2. In the present embodiment, each article 3 is a container for holding one or more substrates, such as semiconductor substrates, and is, more specifically, a FOUP (Front Opening Unified Pod). And the transport target location 91 shown in FIGS. 1 and 2 as an example is a support platform (load port) for a processing device 90 for processing the substrates that had been held in the article 3. Each transport target location 91 is located, for example, in a position that is under the travel path and that overlaps with the travel path as seen along the vertical direction Z, or in a position that is under the travel path and that is located off to one or the other side of the travel path along the path width direction X as seen along the vertical direction Z.

Figure 4:
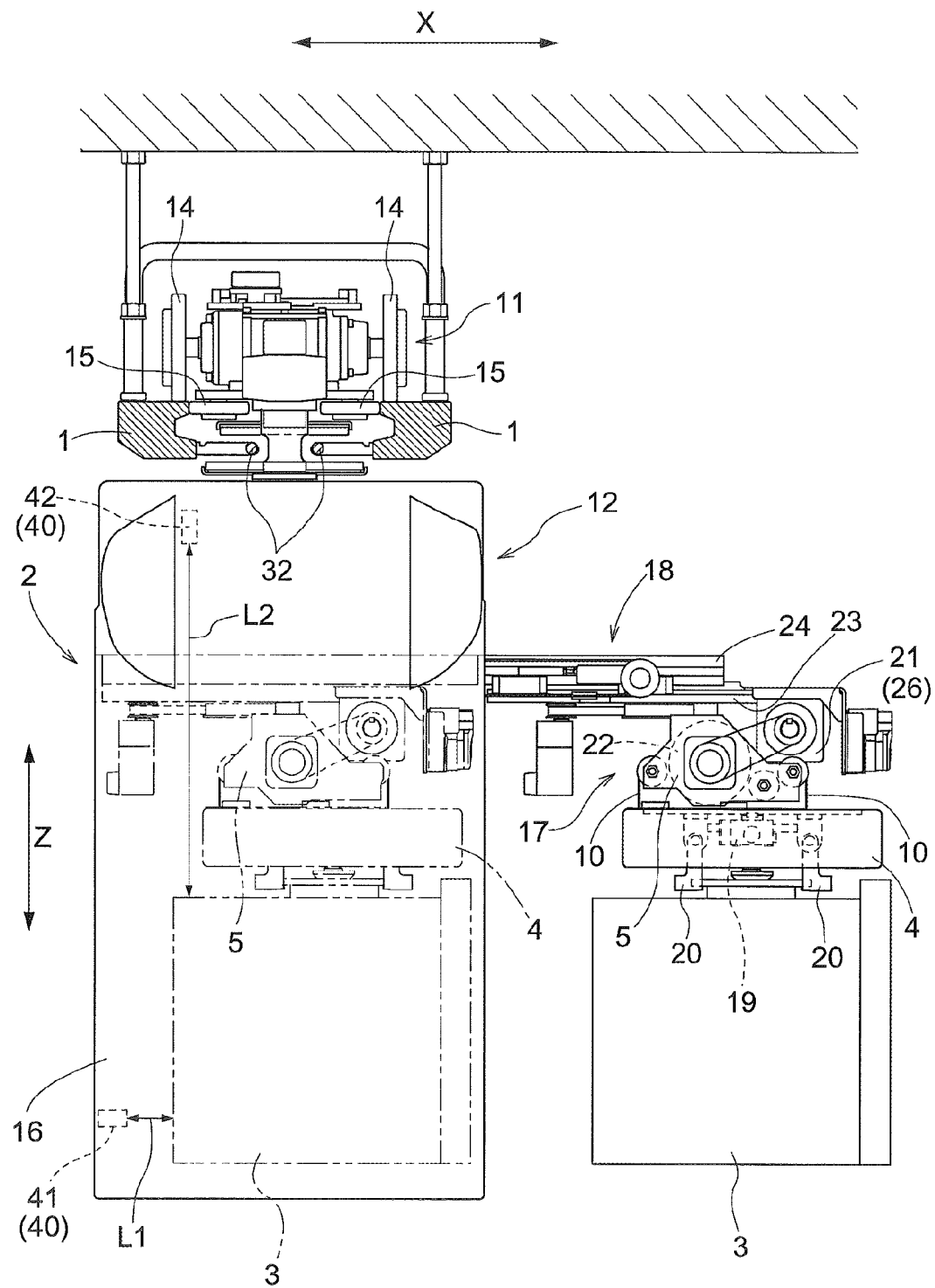
FIG. 4 is a front view of the article transport device.

As shown in FIGS. 3 and 4, in the present embodiment, the travel portion 11 is configured to travel along the travel path while being supported by the travel rails 1 that are suspended from the ceiling. The main body portion 12 is suspended from, and supported by, the travel portion 11 such that the main body portion 12 is located below the travel rails 1. The travel portion 11 has travel wheels 14 which roll on the top surfaces of the travel rails 1. And the travel portion 11 is supported by the travel rails 11 with the travel wheels 14 in contact with the travel rails 11 from above. In the present embodiment, a pair of travel rails 1 that are spaced apart from each other along the path width direction X are provided along the travel path. And the travel portion 11 has travel wheels 14 that roll on the top surface of one of the pair of travel rails 1 and travel wheels 14 that roll on the top surface of the other of the pair of travel rails 1. The travel portion 11 travels by means of the actuating force of the drive motors 13 (see FIG. 3) provided to the travel portion 11. More specifically, the travel portion 11 travels along the travel path as a result of the fact that the travel wheels 14 are driven and rotated by the respective drive motors 13. Note that the travel portion 11 are provided with guide wheels 15 which restrict movement of the travel portion 11 along the path width direction X, and that the travel portion 11 travels along the direction along which the travel rails 1 extend (i.e., along the travel path) with the guide wheels 15 in contact with, and being guided by, the side surfaces of the travel rails 1.

The article transport device 2 is provided with a sliding mechanism 18 which is operated by the actuating force of the actuator device 26 and which is configured to move the second support portion 5 along the path width direction X with respect to the travel portion 11. Because the second support portion 5 suspends and supports the first support portion 4, as the second support portion 5 is moved along the path width direction X with respect to the travel portion 11, the first support portion 4 is also moved to the same side along the path width direction X with respect to the travel portion 11. In other words, the actuator device 26 is configured to move the first support portion 4 along the path width direction X with respect to the travel portion 11 by moving the second support portion 5 along the path width direction X with respect to the travel portion 11, with the path width direction X being specified as one of the plurality of perpendicular directions. The actuator device 26 is configured to be capable of moving the second support portion 5 to both sides, along the path width direction X, of a reference position, along the path width direction X, for the traveling of the travel portion 11 (position of the second support portion 5 shown with phantom lines in FIG. 4). Note that this reference position (retracted position) is a position within the travel path, and, in the present embodiment, is a position within the space (referred to, hereinafter, as the "holding space") that is partitioned off at both ends along the path longitudinal direction Y by the cover 16 provided to the main body portion 12. This holding space opens or communicates to the space outside the holding space (space outside the travel path) through an opening formed on at least one side (both sides in the present embodiment) along the path width direction X. And the first support portion 4, the second support portion 5, and the article 3 supported by the first support portion 4 are moved along the path width direction X through the opening and between inside and outside of the holding space (i.e., between inside and outside of the travel path) without coming into contact with the cover 16.

Figure 5:
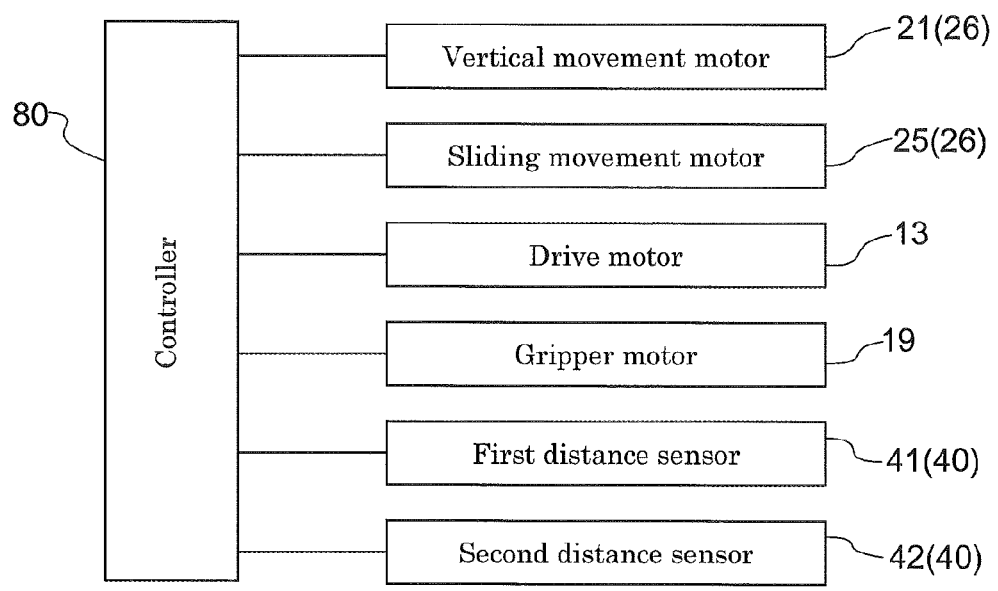
FIG. 5 is a control block diagram.

In the present embodiment, as shown in FIGS. 3 and 5, the actuator device 26 includes an electrical motor 25 (which will be referred to as a sliding movement motor for short and is a servo-motor in the present embodiment) for operating the sliding mechanism 18. In addition, in the present embodiment, as shown in FIGS. 3 and 4, the sliding mechanism 18 includes a first slide movement member 23 and a second slide movement member 24. The second slide movement member 24 is connected, for relative movement along the path width direction X, to a connecting portion of the main body portion 12 (upper portion of the main body portion 12) that connects the main body portion 12 to the travel portion 11. The first slide movement member 23 is connected to the second slide movement member 24 for relative movement along the path width direction X. And the second support portion 5 is fixed to the first slide movement member 23, and is moved integrally with the first slide movement member 23 along the path width direction X. From the state in which the second support portion 5 is located at the aforementioned reference position (state shown with phantom lines in FIG. 4), the actuator device 26 moves the second support portion 5 outward (direction away from the reference position) along the path width direction X by causing the second slide movement member 24 to be slid and moved outward along the path width direction X with respect to the aforementioned connecting portion of the main body portion 12, and by causing the first slide movement member 23 to be slid and moved outward along the path width direction X with respect to the second slide movement member 24, by means of the actuating force of the sliding movement motor 25. The position (projected position) of the second support portion 5 shown with solid lines in FIG. 4 is such a position that the first support portion 4 overlaps, as seen along the vertical direction Z, with the transport target location 91 (not shown in FIG. 4) which is located at a lower position than the travel path and outside the travel path along the path width direction X. In addition, from the state in which the second support portion 5 is located outside the aforementioned reference position along the path width direction X (for example, the state shown with solid lines in FIG. 4), the actuator device 26 moves the second support portion 5 inward (direction toward the reference position) along the path width direction X by causing the second slide movement member 24 to be slid and moved inward along the path width direction X with respect to the aforementioned connecting portion of the main body portion 12, and by causing the first slide movement member 23 to be slid and moved inward along the path width direction X with respect to the second slide movement member 24, by means of the actuating force of the sliding movement motor 25.

In addition, the article transport device 2 is provided with a vertically moving mechanism 17 which is operated by the actuating force of the actuator device 26 and which is configured to move (i.e. raise and lower) the first support portion 4 along the vertical direction X with respect to the second support portion 5. Note that the second support portion 5 can be moved only along the path width direction X with respect to the travel portion 11 and that the position of the second support portion 5 with respect to the travel portion 11 along the vertical direction Z is fixed. Therefore, the amount of movement and the moving direction along the vertical direction Z of the first support portion 4 with respect to the second support portion 5 is identical to the amount of movement and the moving direction along the vertical direction Z of the first support portion 4 with respect to the travel portion 11. The actuator device 26 is configured to be capable of moving the first support portion 4 to both directions along the vertical direction X with respect to a reference height (the height of the first support portion 4 as shown in FIGS. 1, 3, and 4) which is designated for the traveling of the travel portion 11. Note that this reference height (height for traveling or simply "travel height") is a height at which the first support portion 4 is located in the travel path when the second support portion 5 is located at the aforementioned reference position. Thus, the range in which the first support portion 4 can move upward from the reference height is a relatively small range. In the present embodiment, this reference height is set to be such a height that the first support portion 4 is located within the aforementioned holding space formed by the cover 16 when the second support portion 5 is located at the reference position. And when the first support portion 4 is supporting an article 3, the reference height is set to be, in addition, such a height that the article 3 is located within the holding space. This holding space opens or communicates to the space outside the holding space (space outside the travel path) through an opening formed below. And the first support portion 4 and the article 3 supported by the first support portion 4 are moved along the vertical direction Z through this opening and between inside and outside of the holding space (i.e., between inside and outside of the travel path) without coming into contact with the cover 16.

In the present embodiment, as shown in FIGS. 4 and 5, the actuator device 26 includes an electric motor 21 for causing vertical movement (which will be referred to as a vertical movement motor 21 for short and is a servo-motor in the present embodiment) for operating the vertically moving mechanism 17. In addition, in the present embodiment, as shown in FIGS. 3 and 4, the vertically moving mechanism 17 has belt-shaped members 10 (each of which is a member having a width that is greater than its thickness) and the winding members 22 (rotatable drums). Each belt-shaped member 10 is spooled onto the associated winding member 22. And the distal end portion of each belt-shaped member 10 is connected to the first support portion 4. In addition, each winding member 22 is rotatably fixed to the second support portion 5. In other words, the second support portion 5 is provided with the winding members 22 configured to spool the belt-shaped members 10 that are connected to the first support portion 4. Thus, the second support portion 5 suspends and supports the first support portion 4 by means of, and through, the belt-shaped members 10. The actuator device 26 causes the belt-shaped members 10 to be spooled and fed out by rotating the winding members 22 in a forward direction and its opposite direction with the actuating force of the vertical movement motor 21, to raise and lower the first support portion 4. In other words, the actuator device 26 is configured to move the first support portion 4 along the vertical direction Z with respect to the travel portion 11 by rotating the winding members 22 to spool and feed out the belt-shaped members 10 with the vertical direction Z being the aforementioned one of a plurality of perpendicular directions. As shown in FIG. 2, the vertically moving mechanism 17 has three belt-shaped members 10 in the present embodiment. In the present embodiment, the belt-shaped member 10 is, or corresponds to the "elongate flexible member", and each winding member 22 is, or corresponds to, the "winding portion." It is preferable that the elongate flexible member is made of a material or has a structure (such as strands woven or twisted together) that resists or limits stretching or includes a reinforcing material (such as steel cords) that resists or limits stretching under tension. The elongate flexible member may be formed of metal such as steel, rubber, nylon, carbon fiber, or any other known material used in a cord, rope, cable, wire, and the like as well as combination thereof. The belt-shaped member is an example of an elongate flexible member and has a lateral width that is greater than its thickness. In addition, it is also possible to use other elongate flexible members, such as wires, cables, cords, or the like, in place of the belt-shaped members 10. In addition, the vertically moving mechanism 17 may have, for example, two or four or more belt-shaped members 10, a number which is different from 3.

As shown in FIG. 4, in the present embodiment, a flange portion is formed in an upper portion of the article 3. And the first support portion 4 is provided with a pair of the grip portions 20 for gripping or holding this flange portion. The flange portion is connected to a main body portion of the article 3 such that it is located above the main body portion. And an inserting space is formed between the main body portion and the flange portion. The pair of grip portion 20 supports the undersurface of the flange portion from below with each support portion of the pair of grip portion 20 inserted in this inserting space. The first support portion 4 is provided with an electric motor for causing the gripping (gripper motor 19 for short, see FIGS. 4 and 5). And the attitudes or the positions of the pair of grip portions 20 can be changed or switched, by the actuating force of the gripper motor 19, between a gripping attitude (attitude shown in FIG. 4) for gripping or holding an article 3 and a releasing attitude for releasing the gripping of the article 3. More specifically, the attitudes of the pair of grip portions 20 can be changed or switched to the releasing attitude by moving the support portions (of the pair of grip portions 20 in the gripping attitudes) away from each other and thus by moving these support portions out of the aforementioned inserting space. In addition, the attitudes of the pair of grip portions 20 can be changed or switched to the gripping attitude by moving the support portions (of the pair of grip portions 20 in the releasing attitudes) toward each other and thus by inserting these support portions into the aforementioned inserting space.

In the present embodiment, the controller device 80 which controls the operation of the actuator device 26 is also configured to control the operation of the travel portion 11 and the operation of the pair of grip portion 20. In other words, as shown in FIG. 5, the controller device 80 is configured to control the actuation of the drive motor 13 and the gripper motor 19 in addition to the actuation of the vertical movement motor 21 and the sliding movement motor 25 provided to the actuator device 26. The controller device 80 causes the first support portion 4 to be moved along the vertical direction Z by controlling the actuation of the vertical movement motor 21, causes the second support portion 5 to be moved along the path width direction X by controlling the actuation of the sliding movement motor 25, and causes the attitudes of the pair of grip portions 20 to be changed or switched by controlling the actuation of the gripper motor 19. In addition, the controller device 80 causes the travel portion 11 to travel by controlling the actuation of the drive motor 13. The controller device 80 causes the travel portion 11 to travel with the first support portion 4 located within the travel path. In the present embodiment, the controller device 80 causes the travel portion 11 to travel with the first support portion 4 and the second support portion 5 located within the holding space described above, and in addition, with the article 3 located within the holding space when the first support portion 4 is supporting an article 3.

The controller device 80 (the controller) has a processor, such as a microcomputer as well as peripheral circuits, such as a memory circuit. And each function of the controller device 80 is realized through collaboration between the hardware and program(s) executed on such hardware such as a processor. The controller device 80 may be provided so that it may travel integrally with the travel portion 11, or may be provided independently of, and separately from, the travel portion 11 so that it would not travel integrally with the travel portion 11. In addition, if and when the controller device 80 consists of a plurality of pieces of hardware that are mutually separated but are capable of mutual communication, only some of the plurality of pieces of the hardware may be arranged to travel integrally with the travel portion 11 while the rest of the hardware may be provided independently of, and separately from, the travel portion 11.

The controller device 80 is configured to perform a transfer control and an oscillation damping control. The transfer control is a control for controlling the operation of the actuator device 26 while the travel portion 11 is at rest to move the first support portion 4 with respect to the travel portion 11 between a first position within the travel path and a second position for transferring an article 3 between a transport target location 91 and the first support portion 4 (position of the first support portion 4 shown in FIG. 2). In the present embodiment, the second position is set to be lower than the first position. In addition, in the present embodiment, the second position is set to be a position (height) at which the first support portion 4 overlaps with the transport target location 91 as seen along the vertical direction Z, at which it is possible to insert each support portion of the pair of grip portions 20 into the aforementioned inserting space of the article 3 supported by the transport target location 91 by changing or switching the attitudes of the pair of grip portions 20 from the releasing attitudes to the gripping attitudes, and at which it is possible to move each support portion of the pair of grip portions 20 out of the aforementioned inserting space of the article 3 supported by the transport target location 91 by changing or switching the attitudes of the pair of grip portions 20 from the gripping attitudes to the releasing attitudes. In the present embodiment, the controller device 80 performs the transfer control based on a command from a superordinate controller (not shown).

The controller device 80 performs the transfer control when performing a receiving control for causing the article transport device 2 whose first support portion 4 is not supporting any article 3 (referred to, hereinafter, as the "empty load state") to receive an article 3 from a transport target location 91 of transport origin, and also when performing a supplying control for causing the article transport device 2 whose first support portion 4 is supporting an article 3 (referred to, hereinafter, as the "loaded state") to supply (i.e., deliver) the article 3 to a transport target location 91 of transport destination. When performing the receiving control, the controller device 80 performs the transfer control with the travel portion 11 of the article transport device 2 in the empty load state at rest being at the same position, along the path longitudinal direction Y, as the transport target location 91 of the transport origin. In addition, when performing the supplying control, the controller device 80 performs the transfer control with the travel portion 11 of the article transport device 2 in the loaded state being at rest at the same position, along the path longitudinal direction Y, as the transport target location 91 of the transport destination. The transfer control that is performed during the receiving control (referred to, hereinafter, as the "first transfer control") and the transfer control that is performed during the supplying control (referred to, hereinafter, as the "second transfer control") have something in common in that both controls perform the following controls in the following order, namely, a control for moving the first support portion 4 from the first position to the second position, a control for changing or switching the attitudes of the pair of grip portions 20, and a control for moving the first support portion 4 from the second position to the first position. However, the first transfer control and second transfer control are different in that the attitudes of the pair of grip portions 20 are changed or switched from the releasing attitudes to the gripping attitudes in the first transfer control, whereas the attitudes of the pair of grip portions 20 are changed or switched from the gripping attitudes to the releasing attitudes in the second transfer control.

Note that, if the transport target location 91 is located at a lower position than the travel path and outside the travel path along the path width direction X, it is necessary to move the first support portion 4 along the path width direction X between inside and outside of the travel path when the first support portion 4 is moved between the first position and the second position. In such a case, in the present embodiment, the order of execution of the moving operation of the second support portion 5 which supports the first support portion 4 along the path width direction X and the moving operation of the first support portion 4 along the vertical direction Z is set such that the first support portion 4 is moved along the vertical direction Z while the first support portion 4 is located outside the travel path along the path width direction X. That is, when moving the first support portion 4 from the first position to the second position, the first support portion 4 is first moved along the path width direction X to outside the travel path (state shown with solid lines in FIG. 4), and, subsequently, the first support portion 4 is lowered toward the second position. In addition, when moving the first support portion 4 from the second position to the first position, the first support portion 4 is first raised to the same height as the first position (state shown with solid lines in FIG. 4) with the first support portion 4 located outside the travel path along the path width direction X, and subsequently, the first support portion 4 is moved along the path width direction X to within the travel path.

The oscillation damping control is a control for controlling the operation of the actuator device 26 based on a specific physical quantity detected by a detecting device 40 while the travel portion 11 is traveling and the first support portion 4 is supporting an article 3, to reduce the oscillation of the article 3 supported by the first support portion 4 that occurs while the travel portion 11 is traveling. In other words, the oscillation damping control is a control performed during the traveling of the travel portion 11 of the article transport device 2 in the loaded state. During the traveling of the travel portion 11, an oscillation of the article 3 may occur which is caused by, for example, an impact force that the travel wheels 14 receive from one or both of the travel rails 1 (impact force due to a step or a curvature in a travel rail 1 etc.), or the inertial force (centrifugal force etc.) that acts on the article 3. Note that an article 3 is supported by the first support portion 4 such that any movement with respect to the first support portion 4 is restricted or prevented. Therefore, the article 3 may oscillate integrally with the first support portion 4 as the traveling portion 11 travels.

In the present embodiment, the controller device 80 performs a first oscillation damping control and a second oscillation damping control as the oscillation damping control. Here, the first oscillation damping control is a control for reducing the oscillation of the article 3 along the path width direction X. And the second oscillation damping control is a control for reducing the oscillation of the article 3 along the vertical direction Z. The controller device 80 performs the first oscillation damping control when the oscillation of the article 3 along the path width direction X is detected. In the present embodiment, as shown in FIG. 4, the detecting devices 40 includes a first distance sensor 41 (for example, an optical distance sensor etc.) for detecting the position of the article 3 along the path width direction X with respect to the traveling portion 11. In other words, in the present embodiment, the position of the article 3 (supported by the first support portion 4) along the path width direction X with respect to the traveling portion 11 is detected by the first distance sensor 41 as a specific physical quantity along the path width direction X. The controller device 80 determines the presence or absence of an oscillation of the article 3 along the path width direction X based on information detected by the first distance sensor 41. In addition, as shown in FIG. 3, in the present embodiment, arrangements are made so that the position of the first distance sensor 41 can be changed between a detecting position (position shown with dotted lines in FIG. 3) and an out-of-the-way position (position shown as with solid lines in FIG. 3). When transferring an article 3 between the article transport device 2 and the transport target location 91, the first distance sensor 41 is moved to the aforementioned out-of-the-way position if needed. In addition, the controller device 80 performs the second oscillation damping control when the oscillation of the article 3 along the vertical direction Z is detected. In the present embodiment, as shown in FIG. 4, the detecting devices 40 includes a second distance sensor 42 (for example, an optical distance sensor etc.) for detecting the position of the article 3 along the vertical direction Z with respect to the traveling portion 11. In other words, in the present embodiment, the position of the article 3 (supported by the first support portion 4) along the vertical direction Z with respect to the traveling portion 11 is detected by the second distance sensor 42 as a specific physical quantity along the vertical direction Z. The controller device 80 determines the presence or absence of an oscillation of the article 3 along the vertical direction Z based on information detected by the second distance sensor 42.

Figure 7:
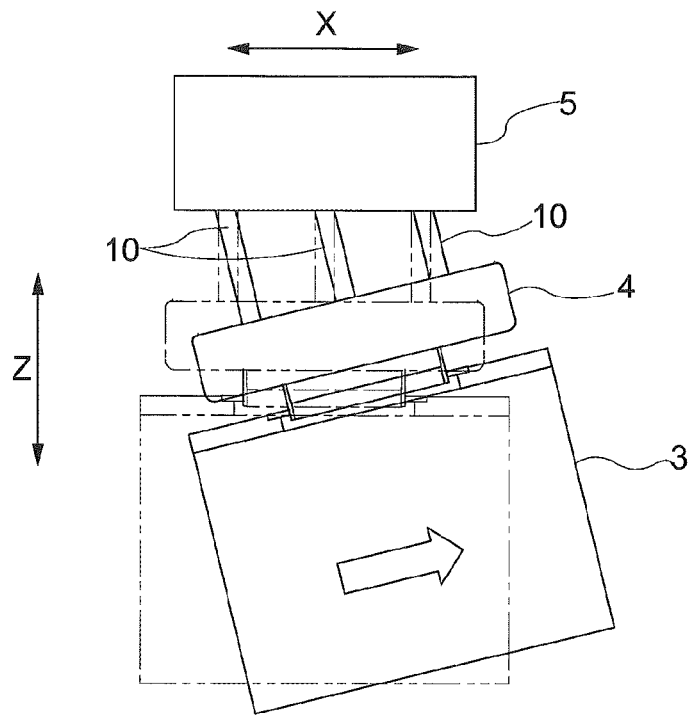
FIG. 7 is a drawing for describing an oscillation of an article along a path width direction.

FIG. 7 is a drawing for describing an oscillation of an article 3 along the path width direction X. In the present embodiment, the first support portion 4 is suspended from, and supported by, the second support portion 5 through the belt-shaped members 10. Thus, considering the situation in terms of a simplified model as shown in FIG. 7, the article 3 supported by the first support portion 4 may oscillate with respect to the second support portion 5 (and with respect to the traveling portion 11) along the path width direction X with an amplitude that depends on the length (simply referred to, hereinafter, as "belt length") of the belt-shaped members 10 from the portion of each belt-shaped member 10 that functions as the point of suspension (fulcrum) to the distal end portion (portion that is connected to the first support portion 4). The article 3 is a container for holding one or more substrates, such as semiconductor substrates in the present embodiment; thus, when the article 3 oscillates along the path width direction X with respect to the second support portion 5, there is a possibility that the substrates may move or shift relative to the container and may be damaged depending on the extent of the oscillation. Note that the first support portion 4 is located within the travel path when the traveling portion 11 is traveling; thus, the belt length is short when the traveling portion 11 is traveling and thus the amplitude of the oscillation along the path width direction X which may occur to the article 3 would be an oscillation with relatively small amplitude in accordance with the short belt length, but that the belt length, extending and contracting of the belt-shaped members 10, and the tilting of the article 3 due to the oscillation, as shown in FIG. 7, are exaggerated for clarity.

Figure 8:
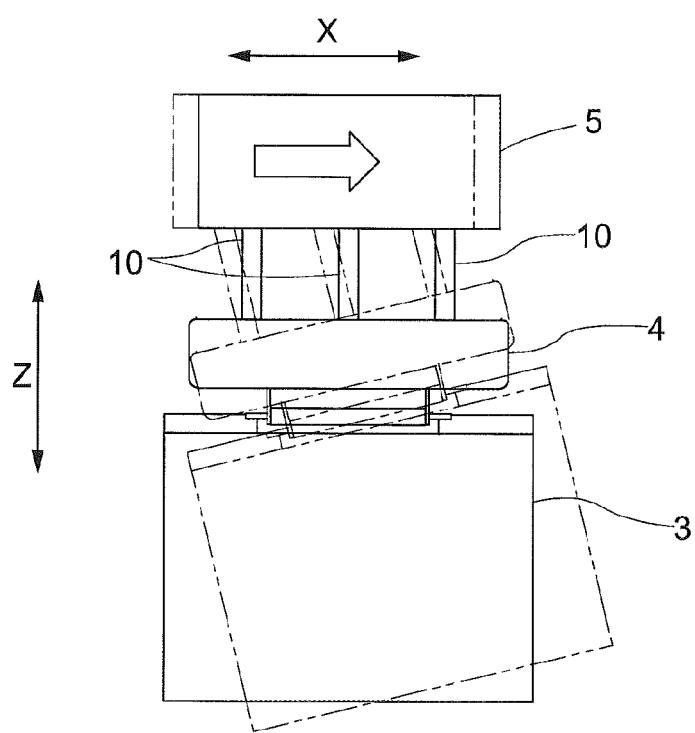
FIG. 8 is a drawing for describing a first oscillation damping control.

The controller device 80 performs the first oscillation damping control to reduce the above-described oscillation of an article 3 along the path width direction X. In the present embodiment, the first oscillation damping control is a control for causing the second support portion 5 to be moved with respect to the traveling portion 11 in the direction that reduces the displacement of the article 3 (supported by the first support portion 4) along the path width direction X with respect to the second support portion 5. Note that "the displacement of the article 3 (supported by the first support portion 4) along the path width direction X with respect to the second support portion 5" is the displacement of the article 3 along the path width direction X with respect to the position of the article 3 along the path width direction X when it is not oscillating. The position of the article 3 along the path width direction X when it is not oscillating changes depending on the position of the second support portion 5 along the path width direction X. As shown in FIG. 7, when the article 3 supported by the first support portion 4 is displaced to one side (to the right in the figure) along the path width direction X with respect to the second support portion 5, the second support portion 5 is moved to the same side (to the right in the figure) along the path width direction X with respect to the traveling portion 11 by performing the first oscillation damping control. As shown in FIG. 8, the oscillation of the article 3 along the path width direction X with respect to the second support portion 5 can be reduced by this. Note that FIG. 8 shows a situation where the second support portion 5 has moved, along the path width direction X with respect to the traveling portion 11, to the position along the path width direction X at which the displacement of the article 3 with respect to the second support portion 5 is zero.

While not shown, when the article 3 supported by the first support portion 4 is displaced to the other side (to the left in the figure) along the path width direction X with respect to the second support portion 5, the second support portion 5 is moved to the same side (to the left in the figure) along the path width direction X with respect to the traveling portion 11 by performing the first oscillation damping control. Although the second support portion 5 is moved from the reference position described above along the path width direction X by performing the first oscillation damping control, the second support portion 5 is located at the reference position described above at least when the traveling portion 11 starts traveling.

Figure 9:
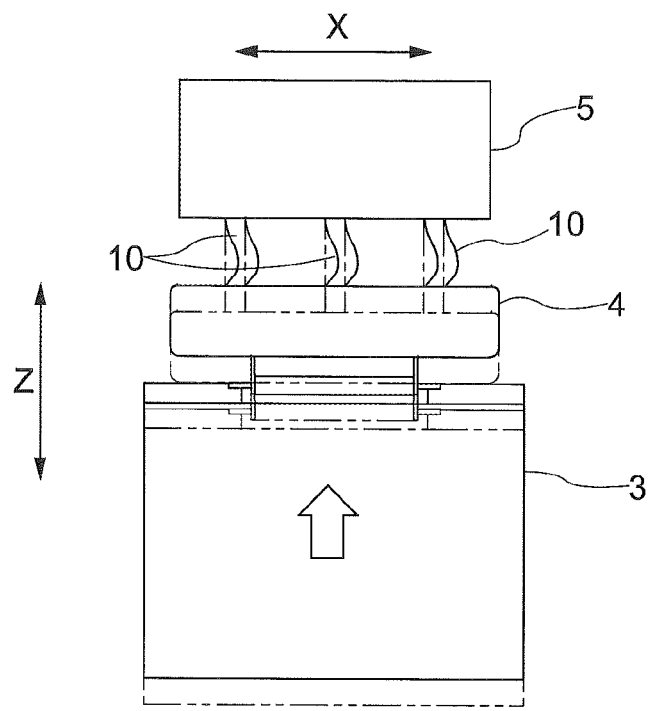
FIG. 9 is a drawing for describing a vertical oscillation of an article.

FIG. 9 is a drawing for describing a vertical oscillation of an article 3. In the present embodiment, the first support portion 4 is suspended from, and supported by, the second support portion 5 through the belt-shaped members 10. And because the belt-shaped members 10 are flexible, the article 3 supported by the first support portion 4 can oscillate along the vertical direction Z with respect to the second support portion 5 (with respect to traveling portion 11). The tension in the belt-shaped members 10 also changes as the article 3 supported by the first support portion 4 oscillates along the vertical direction Z. In the description below, the tension in the belt-shaped members 10 when the article 3 is not oscillating will be referred to as the "reference tension". The height of the article 3 at which the tension of the belt-shaped members 10 is equal to the aforementioned reference tension changes depending on the belt length. When the article 3 supported by the first support portion 4 is displaced to positions above the height at which the tension in the belt-shaped members 10 is equal to the reference tension, the tension in the belt-shaped members 10 becomes less than the reference tension. And when the article 3 supported by the first support portion 4 is displaced to positions below the height at which the tension in the belt-shaped members 10 is equal to the reference tension, the tension in the belt-shaped members 10 becomes greater than the reference tension. And when the article 3 oscillates along the vertical direction Z with respect to the second support portion 5, there is a possibility that the substrates may move or shift relative to the container and may be damaged, depending on the extent of the oscillation, as with the case of when the article 3 oscillates along the path width direction X with respect to the second support portion 5. For example, there is a possibility that the substrates may be damaged by the impact force the substrate may receive from the container when the tension in the belt-shaped members 10 increases suddenly. Note that, although the belt length during the traveling of the traveling portion 11 is short as described above, the belt length, the amount of bending of the belt-shaped members 10, and the amount of displacement of the article 3 along the vertical direction Z shown are exaggerated for clarity.

Figure 10:
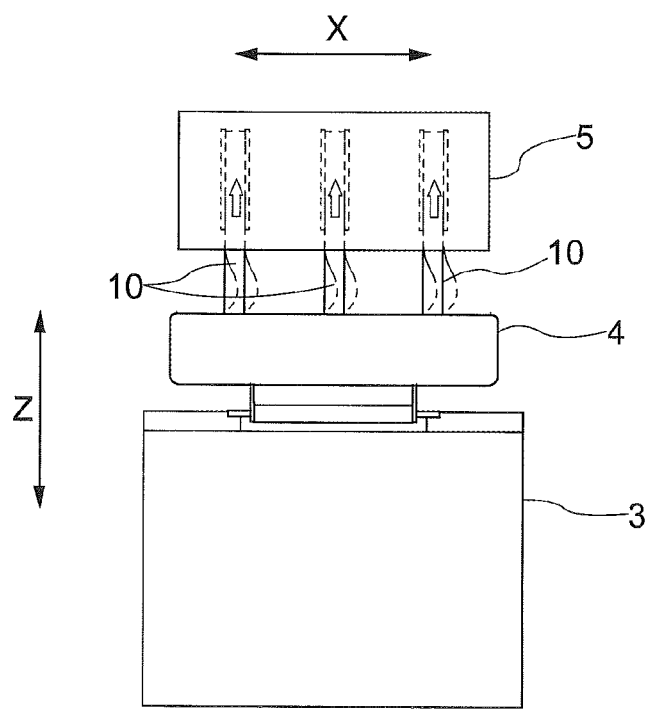
FIG. 10 is a drawing for describing a second oscillation damping control.

The controller device 80 performs the second oscillation damping control to reduce the above-described oscillation of the article 3 along the vertical direction Z. In the present embodiment, the second oscillation damping control is a control for causing the winding members 22 to be rotated in the rotational direction that reduces the amount of change in the tension in the belt-shaped members 10. As shown in FIG. 9, when the article 3 supported by the first support portion 4 is displaced to positions above the height at which the tension in the belt-shaped members 10 is equal to the reference tension, the tension in the belt-shaped members 10 becomes smaller. In this case, by performing the second oscillation damping control, the winding members 22 are rotated in the rotational direction that reduces the amount of decrease in the tension in the belt-shaped members 10, i.e., the rotational direction in which the belt-shaped members 10 are spooled onto respective winding members 22. Thus, as shown in FIG. 10, the tension of the belt-shaped members 10 can be maintained at, or close to, the reference tension by decreasing the belt length. And the oscillation of the article 3 along the vertical direction Z with respect to the second support portion 5 (with respect to the traveling portion 11) can be reduced. While not shown, when the article 3 supported by the first support portion 4 is displaced to positions below the height at which the tension of each belt-shaped member 10 is equal to the reference tension, the tension in the belt-shaped members 10 becomes greater. In this case, by performing the second oscillation damping control, the winding members 22 are rotated in the rotational direction that reduces the amount of increase in the tension in the belt-shaped members 10, i.e., the rotational direction in which the belt-shaped members 10 are fed out from respective winding members 22. Thus, as shown in FIG. 10, the tension of each belt-shaped member 10 can be maintained at, or close to, the reference tension by increasing the belt length. And the oscillation of the article 3 along the vertical direction Z with respect to the second support portion 5 can be reduced. Although the first support portion 4 is moved upward or downward from the reference height by performing the second oscillation damping control, the first support portion 4 is located at the reference height at least when the traveling portion 11 starts traveling.

Figure 11:
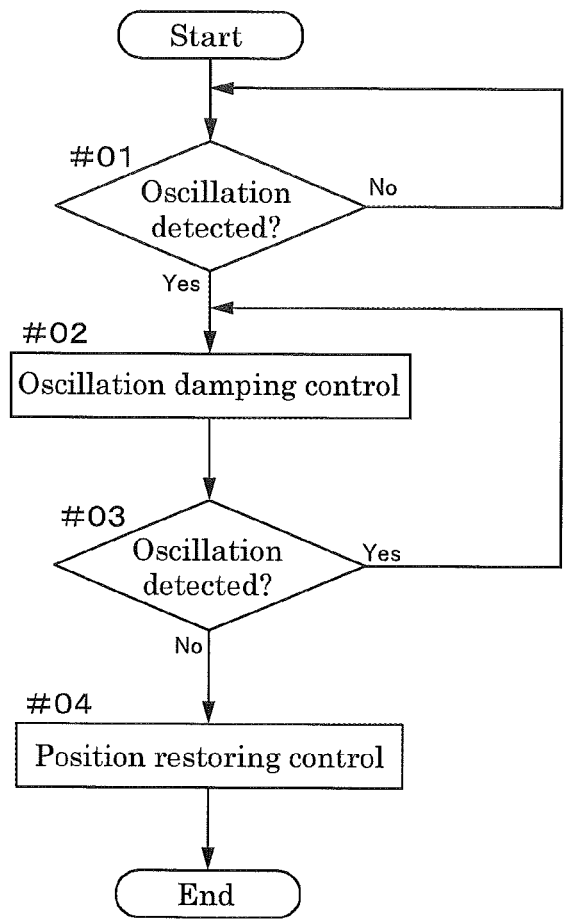
FIG. 11 is a flow chart for a control.

FIG. 11 shows an example of a control flow performed by the controller device 80 when the traveling portion 11 is traveling and the first support portion 4 is supporting an article 3. As shown in FIG. 11, if an oscillation of the article 3 is detected (Step #01: Yes), the controller device 80 performs the oscillation damping control (step #02). In addition, the determination of Step #01 is repeatedly performed at every control period defined in advance, while the oscillation damping control (step #02) is not performed.

In the present embodiment, the controller device 80 determines the presence or absence of an oscillation of the article 3 based on the information detected by a detecting device 40. More specifically, the controller device 80 determines the presence or absence of an oscillation of the article 3 along the path width direction X based on the information detected by the first distance sensor 41, and determines the presence or absence of an oscillation of the article 3 along the vertical direction Z based on the information detected by the second distance sensor 42. The controller device 80 obtains, as the determined value, for example, the position or the amount of displacement of the article 3 along the path width direction X with respect to the second support portion 5 ("with respect to the second support portion 5" may be replaced by "with respect to the travel portion 11" in the following description), the moving speed of the article 3 along the path width direction X with respect to the second support portion 5, or the acceleration of the article 3 along the path width direction X with respect to the second support portion 5, etc., and determines to have detected an oscillation of the article 3 along the path width direction X if the determined value exceeds a threshold value defined in advance. In addition, the controller device 80 obtains, as the determined value, for example, the position or the amount of displacement of the article 3 along the vertical direction Z with respect to the second support portion 5 ("with respect to the second support portion 5" may be replaced by "with respect to the travel portion 11" in the following description), the moving speed of the article 3 along the vertical direction Z with respect to the second support portion 5, or the acceleration of the article 3 along the vertical direction Z with respect to the second support portion 5, etc., and determines to have detected an oscillation of the article 3 along the vertical direction Z if the determined value exceeds a threshold value defined in advance.

The controller device 80 repeatedly performs the oscillation damping control (Step #02), while the oscillation of the article 3 is detected (Step #03: Yes). The determination of Step #03 is repeatedly performed at every control period defined in advance. And if the oscillation of the article 3 is no longer detected (Step #03: No), the controller device 80 performs a position restoring control (Step #04) and the control is returned to Step #01. The controller device 80 determines that no oscillation of the article 3 is detected, for example, when the determined value described above is below the threshold value defined in advance. As described above, by performing the first oscillation damping control, the second support portion 5 is moved along the path width direction X from the reference position; and, by performing the second oscillation damping control, the first support portion 4 is moved upward or downward from the reference height. The position restoring control of Step #04 is a control for returning the position of the second support portion 5 along the path width direction X to the reference position when the first oscillation damping control has been performed, and is a control for returning the height of the first support portion 4 to the reference height when the second oscillation damping control has been performed. In this position restoring control, the speed of the first support portion 4 or the second support portion 5 is set to be such a slow speed that substantially no oscillation of the article 3 is generated. Note that, although FIG. 11 illustrates an example in which the position restoring control is performed each time an oscillation is no longer detected, an arrangement may be made such that the position restoring control is performed at a different timing. For example, the position restoring control may be performed only when the position of the first support portion 4 along the vertical direction Z with respect to the second support portion 5 falls outside a range defined in advance, or only when the position of the second support portion 5 along the path width direction X with respect to the traveling portion 11 falls outside a range defined in advance. Alternatively, for example, the position restoring control may be performed when the traveling portion 11 stops.

In the present embodiment, the controller device 80 performs the first oscillation damping control when the oscillation of the article 3 along the path width direction X is detected, and performs the second oscillation damping control when the oscillation of the article 3 along the vertical direction Z is detected. Therefore, when the oscillation of the article 3 along both the path width direction X and the vertical direction Z is detected in the determination of Step #01, both the first oscillation damping control and the second oscillation damping control are performed in the oscillation damping control of Step #02. And even if the oscillation of the article 3 along one of the path width direction X and the vertical direction Z is no longer detected in the determination of Step #03, the first oscillation damping control or the second oscillation damping control for reducing the oscillation along the other direction is continued to be performed. And the oscillation damping control is stopped when the oscillation of the article 3 along the path width direction X is no longer detected and the oscillation of the article 3 along the vertical direction Z is no longer detected. Subsequently, in the example shown in FIG. 11, the control goes on to the position restoring control (Step #04).

In addition, when an oscillation of the article 3 along only one of the path width direction X and the vertical direction Z is detected in the determination of Step #01, one of the first oscillation damping control and the second oscillation damping control that reduces the oscillation along the one of the two directions is performed in the oscillation damping control of Step #02. And when the oscillation along the one of the two directions is no longer detected without an oscillation along the other of the two directions being detected, then the oscillation damping control is stopped without performing any oscillation damping control for reducing the oscillation along the other of the two directions. Subsequently, in the example shown in FIG. 11, the control goes on to the position restoring control (Step #04). On the other hand, when an oscillation along the other of the two directions is detected before the oscillation along the one of the two directions stops being detected, both the first oscillation damping control and the second oscillation damping control are performed. Note that an arrangement may be made so that, while one of the first oscillation damping control and the second oscillation damping control is being performed, the oscillation damping control for the other of the two directions is prevented from being performed.

Lastly, an arrangement of the control system in accordance with the present embodiment for performing the first oscillation damping control and the second oscillation damping control described above is described next with reference to FIG. 6. In the present embodiment, as described below, the controller device 80 obtains, in the first oscillation damping control, the relative acceleration of the article 3 (supported by the first support portion 4) along the path width direction X with respect to the traveling portion 11, based on the specific physical quantity detected by a detecting device 40 (the first distance sensor 41), and causes the second support portion 5 to be moved with respect to the traveling portion 11 at an acceleration that depends on the obtained relative acceleration. In addition, in the present embodiment, the controller device 80 obtains, in the second oscillation damping control, a vertical acceleration which is the relative acceleration of the article 3 (supported by the first support portion 4) along the vertical direction Z with respect to the traveling portion 11, based on the specific physical quantity detected by a detecting device 40 (the second distance sensor 42), and causes the rotational speed of the winding members 22 to be changed at a rotational acceleration that depends on the obtained vertical acceleration. Note that FIG. 6 may represent either the first oscillation damping control or the second oscillation damping control without making a distinction between the two because the control system for the first oscillation damping control and the control system for second oscillation damping control basically have an identical structure except for the fact that the detecting device 40 is the first distance sensor 41 in one control and is the second distance sensor 42 in the other control, and that the actuator device 26 is the sliding movement motor 25 is in one and the vertical movement motor 21 in the other.

Figure 6:
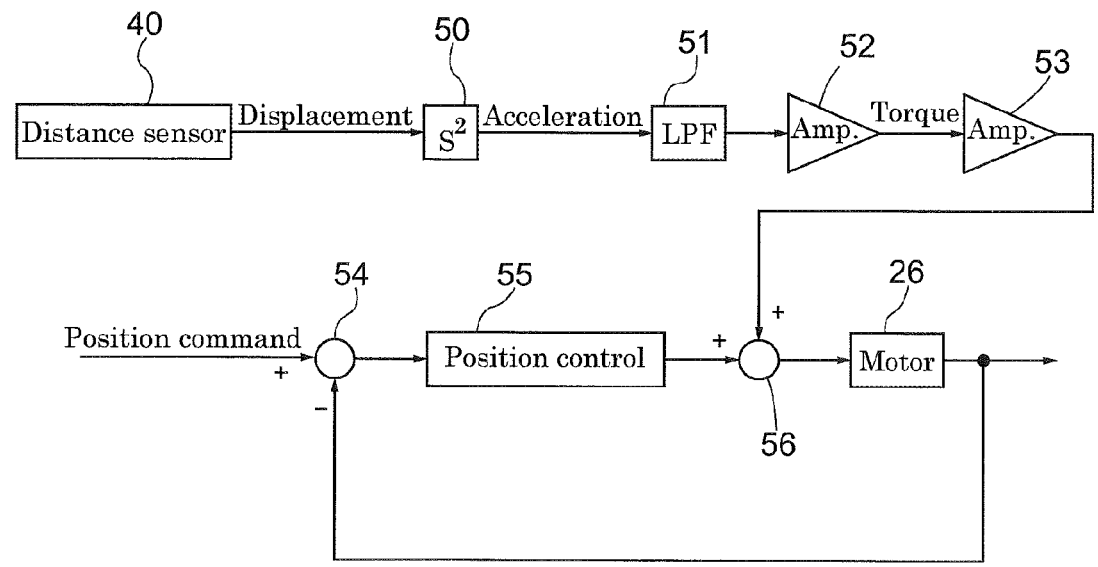
FIG. 6 is a block diagram showing a control system for an oscillation damping control.

As shown in FIG. 6, the controller device 80 includes a control system in which a position feedback control system including a subtractor 54 and a position-control circuit 55 is combined with an oscillation damping torque generating system including a detecting device 40 (a distance sensor), a second-order differentiator 50, a filter 51, a first amplifier 52 (a first gain), and a second amplifier 53 (a second gain). Here, the subtractor 54 outputs the difference (positional deviation) between a position command and the detected position of an actuator device 26 (motor). And the position-control circuit 55 outputs a base torque that would cause the positional deviation to be, or approach, zero. In the case of the first oscillation damping control, the base torque is the amount of torque for maintaining the second support portion 5 at the present position (or the aforementioned reference position at least when the traveling portion 11 starts traveling). And, in the case of the second oscillation damping control, the base torque is the amount of torque for maintaining the first support portion 4 at the present height (or the aforementioned reference height at least when the traveling portion 11 starts traveling). And an oscillation damping torque (described below) generated by the oscillation damping torque generating system is added to the base torque by the adder or summer 56 to generate a torque command outputted to the actuator device 26 (motor). Note that the position-control circuit 55 may also obtain information on the detected speed of the actuator device 26 (motor) so that a speed control is performed in addition to the position control.

In the case of the first oscillation damping control, the oscillation damping torque is a torque for moving the second support portion 5 with respect to the traveling portion 11 in the direction that reduces the displacement of the article 3 (supported by the first support portion 4) along the path width direction X with respect to the second support portion 5. In addition, in the case of second oscillation damping control, the oscillation damping torque is a torque for rotating the winding members 22 in the rotational direction that reduces the amount of change in the tension in the belt-shaped members 10. Such oscillation damping torque is generated in the following manner. The second-order differentiator 50 outputs an acceleration by differentiating twice the displacement detected by a detecting device 40 (distance sensor). In the case of the first oscillation damping control, this acceleration is the acceleration of the article 3 along the path width direction X with respect to the traveling portion 11 whereas, in the case of second oscillation damping control, this acceleration is the acceleration of the article 3 along the vertical direction Z with respect to the traveling portion 11. The filter 51 performs low pass filtering on the signals representing the acceleration outputted from the second-order differentiator 50. The first amplifier 52 generates signals representing the oscillation damping torque by multiplying the signals representing the acceleration by a gain after the filtering. And the second amplifier 53 generates signals representing the oscillation damping torque that are converted into suitable values for the motor shaft by multiplying the signals representing the oscillation damping torque by a gain, and output them to the adder 56. Note that the low pass filtering can be used, among other purposes, to remove noises in the detected signals, and/or high frequency components of the oscillation that are difficult to deal with by the oscillation damping control. In addition, in the case of the first oscillation damping control, the low pass filtering can be used to remove components of the oscillation other than the component attributable to a pendulum-like oscillation (natural frequency) that depends on, and is a function of, the belt length.

The oscillation damping torque generated by the oscillation damping torque generating system as described above is a torque of a magnitude that is proportional to the magnitude of the acceleration of the article 3. And, in the first oscillation damping control, by properly setting the magnitude and the sign of the gain by which the signals representing the acceleration are multiplied by the first amplifier 52, the second support portion 5 can be moved with respect to the traveling portion 11 at an acceleration that depends on the relative acceleration of the article 3 supported by the first support portion 4 along the path width direction X with respect to the traveling portion 11 (for example, at the acceleration of the same magnitude as the relative acceleration) and in the direction that reduces the displacement of the article 3 along the path width direction X with respect to the second support portion 5. Similarly, in the second oscillation damping control, by properly setting the magnitude and the sign of the gain by which the signals representing the acceleration are multiplied by the first amplifier 52, the rotational speed of the winding members 22 can be changed at an acceleration that depends on the vertical acceleration which is the relative acceleration of the article 3 (supported by the first support portion 4) along the vertical direction Z with respect to the traveling portion 11, and in the rotational direction that reduces the amount of change in the tension in the belt-shaped members 10. This rotational acceleration may, for example, be the rotational acceleration at which the amount of change in the length of the belt-shaped members becomes equal to the amount of displacement of the first support portion 4 along the vertical direction Z.

Other Embodiments

The other embodiments of the article transport device are described next. Note that the arrangements disclosed in each of the following embodiments can also be used in combination with the arrangements disclosed in any other embodiment unless inconsistency arises.

(1) In the embodiment described above, an example is described in which the first oscillation damping control is a control for causing the second support portion 5 to be moved with respect to the traveling portion 11 in the direction that reduces the displacement of the article 3 (supported by the first support portion 4) along the path width direction X with respect to the second support portion 5, and in which the second oscillation damping control is a control for causing the winding members 22 to be rotated in the rotational direction that reduces the amount of change in the tension in the belt-shaped members 10. However, the present invention is not limited to such an arrangement. Arrangements may be made so that an oscillation damping control which is different from that in the embodiment described above may be performed as the first oscillation damping control, and so that an oscillation damping control which is different from that in the embodiment described above may be performed as the second oscillation damping control. For example, the first oscillation damping control may be a control for causing the second support portion 5 to be moved with respect to the traveling portion 11 in the direction that reduces the speed of the article 3 (supported by the first support portion 4) along the path width direction X with respect to the second support portion 5.

(2) In the embodiment described above, an example is described in which the detecting devices 40 includes the first distance sensor 41 which detects the position of the article 3 (supported by the first support portion 4) along the path width direction X with respect to the traveling portion 11 as a sensor for detecting the specific physical quantity along the path width direction X as well as the second distance sensor 42 which detects the position of the article 3 (supported by the first support portion 4) along the vertical direction Z with respect to the traveling portion 11 as a sensor for detecting the specific physical quantity along the vertical direction Z. However, the present invention is not limited to such an arrangement. And the detecting devices 40 may include, as a sensor for detecting the specific physical quantity along the path width direction X, a sensor which detects the velocity of the article 3 (supported by the first support portion 4) along the path width direction X with respect to the traveling portion 11 or a sensor which detects the acceleration of the article 3 (supported by the first support portion 4) along the path width direction X with respect to the traveling portion 11. Similarly, the detecting devices 40 may include, as a sensor for detecting the specific physical quantity along the vertical direction Z, a sensor which detects the velocity of the article 3 (supported by the first support portion 4) along the vertical direction Z with respect to the traveling portion 11 or a sensor which detects the acceleration of the article 3 (supported by the first support portion 4) along the vertical direction Z with respect to the traveling portion 11. In addition, because the article 3 is basically moved integrally with the first support portion 4 as the traveling portion 11 travels, the detecting device 40 may indirectly detect a physical quantity (specific physical quantity) that represents a motion of the article 3 (supported by the first support portion 4) with respect to the traveling portion 11. More specifically, the detecting device 40 may detect a physical quantity representing a motion of the first support portion 4 (that is supporting the article 3) with respect to the traveling portion 11, and may treat the detected physical quantity as the specific physical quantity.

(3) In the embodiment described above, an example is described in which the controller device 80 performs both the first oscillation damping control and the second oscillation damping control as the oscillation damping control. However, the present invention is not limited to such an arrangement. The controller device 80 may perform only one of the first oscillation damping control and the second oscillation damping control as the oscillation damping control.

(4) In the embodiment described above, an example is described in which, as shown in FIG. 4, the sliding mechanism 18 is capable of moving the second support portion 5 along the path width direction X with respect to the traveling portion 11 until the entire article 3 supported by the first support portion 4 is located outside the travel path along the path width direction X. However, the present invention is not limited to such an arrangement. The movable range in which the second support portion 5 can be moved along the path width direction X respect to the traveling portion 11 by the sliding mechanism 18 may be such a range that at least a part of the article 3 supported by the first support portion 4 remains in the travel path along the path width direction X. Alternatively, the movable range may be such that the entire article 3 supported by the first support portion 4 remains in the travel path along the path width direction X.

(5) In the embodiment described above, an example is described in which the actuator device 26 is capable of moving the first support portion 4 with respect to the traveling portion 11 along each of the path width direction X and the vertical direction Z. However, the present invention is not limited to such an arrangement. The actuator device 26 may be capable of moving the first support portion 4 with respect to the traveling portion 11 along only one of the path width direction X and the vertical direction Z.

(6) In the embodiment described above, an example is described in which the main body portion 12 is suspended from, and supported by, the traveling portion 11. However, the present invention is not limited to such an arrangement. The main body portion may be supported by the traveling portion 11 such that the main body portion 12 is located above the traveling portion 11.

(7) In the embodiment described above, an example is described in which the article 3 is a container for holding one or more substrates, such as semiconductor substrates. However, the present invention is not limited to such an arrangement. For example, the article 3 may be a container for holding one or more objects other than substrates, such as an industrial product, food, and medicine. In addition, the article 3 may be an object other than a container.

(8) With respect to other arrangements, features, and structures disclosed in the embodiments in the present specification should be understood to be merely examples in all respects. Therefore, a person skilled in the art would be able to make various modifications and changes as appropriate without deviating from the spirit of the present disclosure.

Summary of Embodiments Described Above

A brief summary of the article transport device described above is provided next.

An article transport device comprises: a travel portion configured to travel along a travel path; a first support portion configured to support an article; an actuator configured to move the first support portion with respect to the travel portion along at least one of a plurality of perpendicular directions which are perpendicular to a direction along the travel path; a controller configured to control operation of the actuator; a detector configured to detect a physical quantity that represents a motion, with respect to the travel portion, of the article supported by the first support portion along a moving direction along which the first support portion is moved with respect to the travel portion by the actuator; wherein the controller is configured to perform a transfer control and an oscillation damping control, wherein the transfer control is a control for controlling an operation of the actuator while the travel portion is at rest to cause the first support portion to be moved with respect to the travel portion between a first position within the travel path and a second position for transferring the article between the first support portion and a transport target location which is one of a transport origin and a transport destination for the article, and wherein the oscillation damping control is a control for controlling operation of the actuator based on the physical quantity detected by the detector while the travel portion is traveling and the first support portion is supporting an article, to reduce an oscillation of the article supported by the first support portion that occurs while the travel portion is traveling.

With the arrangement described above, by the oscillation damping control performed by the controller, the oscillation of the article supported by the first support portion that occurs while the travel portion is traveling (i.e., oscillation resulting from the traveling of the travel portion) can be reduced. And such reduction in the oscillation that occurs while the traveling portion is traveling is done by controlling the operation of the actuator provided to the article transport device for transferring an article between the article transport device and a transport target location. In other words, an oscillation damping control can be performed through an effective use of the actuator and a controller that are already provided to the article transport device, without having to provide a separate device exclusively for an oscillation damping control. In addition, the performance (processing power etc.) required of the controller is not increased excessively by requiring it to perform the oscillation damping control because the actuator is not operated for the purpose of transferring an article while the travel portion is traveling during which the oscillation damping control is performed, i.e., because the period in which the oscillation damping control is performed does not overlap with the period in which the transfer control is performed.

As such, with the arrangement described above, an article transport device can be provided in which an oscillation of an article resulting from the traveling of a travel portion can be reduced by means of a relatively simple arrangement.

Here, the article transport device preferably further comprises a second support portion which is supported by the travel portion, and suspends and supports the first support portion; wherein the actuator is preferably configured to move the second support portion along a path width direction which is a lateral width direction of the travel path and with respect to the travel portion to move the first support portion along the path width direction with respect to the travel portion with the path width direction designated as one of the at least one of a plurality of perpendicular directions, and wherein, in the oscillation damping control, the controller preferably causes the second support portion to be moved with respect to the traveling portion in a direction that reduces a displacement of the article supported by the first support portion along the path width direction with respect to the second support portion.

With the arrangement described above, in the oscillation damping control, the second support portion is moved with respect to the traveling portion in the direction that reduces the displacement of the article supported by the first support portion along the path width direction with respect to the second support portion. Since the first support portion suspended from and supported by the second support portion, the article supported by the first support portion may oscillate like a pendulum form with respect to the second support portion along the path width direction. However, the displacement of an article along the path width direction with respect to the second support portion is reduced by the oscillation damping control so that the angle or the amplitude of the oscillation can be reduced to a relatively small value. As a result, the oscillation of the article along the path width direction with respect to the second support portion can be reduced properly.

In addition, in the oscillation damping control, the controller preferably obtains a relative acceleration of the article supported by the first support portion along the path width direction with respect to the traveling portion, based on the physical quantity detected by the detector, and causes the second support portion to be moved with respect to the traveling portion at an acceleration that depends on the relative acceleration that is obtained.

With the arrangement described above, it becomes possible, while the oscillation damping control is being performed, to set the amount of movement of the second support portion along the path width direction with respect to the travel portion at each point in time to be a proper amount for effectively reducing the oscillation, depending on the magnitude of the acceleration of the article supported by the first support portion along the path width direction with respect to the travel portion at each point in time.

In addition, the article transport device preferably further comprises a second support portion which is supported by the travel portion, and suspends and supports the first support portion; wherein the second support portion is preferably provided with winding portions for spooling elongate flexible members that are connected to the first support portion, wherein the actuator is preferably configured to move the first support portion along the vertical direction with respect to the travel portion by rotating the winding portions to spool or feed out the elongate flexible members with the vertical direction designated as one of the at least one of a plurality of perpendicular directions, and wherein, in the oscillation damping control, the controller preferably causes the winding members to be rotated in a rotational direction that reduces an amount of change in tension in the elongate flexible members.

With the arrangement described above, in the oscillation damping control, the winding members are rotated in a rotational direction that reduces an amount of change in tension in the elongate flexible members. Therefore, the article supported by the first support portion can be displaced along the vertical direction with respect to the second support portion or the travel portion because the first support portion suspended from and supported by the second support portion through the elongate flexible members and because the elongate flexible members are flexible. However, because the amount of tension in the elongate flexible members is reduced by the oscillation damping control, it becomes possible to maintain the tension in the elongate flexible members within a preset range. Therefore, it becomes possible to properly avoid a problem that may be caused by a large change in the tension in the elongate flexible members, such as a phenomenon of a large impact force acting on an article because of a sudden increase in the tension in the elongate flexible members.

In addition, in the oscillation damping control, the controller preferably obtains a vertical acceleration which is a relative acceleration of the article supported by the first support portion along the vertical direction with respect to the traveling portion, based on the physical quantity detected by the detector, and causes a rotational speed of the winding portions to be changed at a rotational acceleration that depends on the vertical acceleration that is obtained.

With the arrangement described above, it becomes possible, while the oscillation damping control is being performed, to set the rotational speed of the winding portions at each point in time to be a proper rotational speed for effectively reducing the amount of change in the tension in the elongate flexible members, depending on the magnitude of the vertical acceleration of the article supported by the first support portion at each point in time.

What is claimed is:

1. An article transport device comprising:
    a travel portion configured to travel along a travel path;
    a first support portion configured to support an article;
    an actuator configured to move the first support portion with respect to the travel portion along at least one of a plurality of perpendicular directions which are perpendicular to a direction along the travel path;
    a controller configured to control operation of the actuator; and
    a detector configured to detect a physical quantity that represents a motion, with respect to the travel portion, of the article supported by the first support portion along a moving direction along which the first support portion is moved with respect to the travel portion by the actuator;
    wherein the controller is configured to perform a transfer control and an oscillation damping control,
    wherein the transfer control is a control for controlling an operation of the actuator while the travel portion is at rest to cause the first support portion to be moved with respect to the travel portion between a first position within the travel path and a second position for transferring the article between the first support portion and a transport target location which is one of a transport origin and a transport destination for the article, and
    wherein the oscillation damping control is a control for controlling operation of the actuator based on the physical quantity detected by the detector while the travel portion is traveling and the first support portion is supporting an article, to reduce an oscillation of the article supported by the first support portion that occurs while the travel portion is traveling.

2. The article transport device as defined in claim 1, further comprising:
    a second support portion which is supported by the travel portion, and suspends and supports the first support portion; and
    wherein the actuator is configured to move the second support portion along a path width direction which is a lateral width direction of the travel path and with respect to the travel portion to move the first support portion along the path width direction with respect to the travel portion with the path width direction designated as one of the at least one of a plurality of perpendicular directions, and
    wherein, in the oscillation damping control, the controller causes the second support portion to be moved with respect to the traveling portion in a direction that reduces a displacement of the article supported by the first support portion along the path width direction with respect to the second support portion.

3. The article transport device as defined in claim 2, wherein in the oscillation damping control, the controller obtains a relative acceleration of the article supported by the first support portion along the path width direction with respect to the traveling portion, based on the physical quantity detected by the detector, and causes the second support portion to be moved with respect to the traveling portion at an acceleration that depends on the relative acceleration that is obtained.

4. The article transport device as defined in claim 1, further comprising:
    a second support portion which is supported by the travel portion, and suspends and supports the first support portion; and
    wherein the second support portion is provided with winding portions for spooling elongate flexible members that are connected to the first support portion,
    wherein the actuator is configured to move the first support portion along the vertical direction with respect to the travel portion by rotating the winding portions to spool or feed out the elongate flexible members with the vertical direction designated as one of the at least one of a plurality of perpendicular directions, and
    wherein, in the oscillation damping control, the controller causes the winding members to be rotated in a rotational direction that reduces an amount of change in tension in the elongate flexible members.

5. The article transport device as defined in claim 4, wherein in the oscillation damping control, the controller obtains a vertical acceleration which is a relative acceleration of the article supported by the first support portion along the vertical direction with respect to the traveling portion, based on the physical quantity detected by the detector, and causes a rotational speed of the winding portions to be changed at a rotational acceleration that depends on the vertical acceleration that is obtained.

* * * * *